United States Patent
Morita et al.

(10) Patent No.: US 7,651,958 B2
(45) Date of Patent: Jan. 26, 2010

(54) SEMICONDUCTOR DEVICE AND METHOD OF MANUFACTURING THEREOF

(75) Inventors: Yoshitsuga Morita, Chiba Prefecture (JP); Katsutoshi Mine, Chiba Prefecture (JP); Junji Nakanishi, Chiba Prefecture (JP); Hiroji Enami, Chiba Prefecture (JP)

(73) Assignee: Dow Corning Toray Company, Ltd., Tokyo (JP)

( * ) Notice: Subject to any disclaimer, the term of this patent is extended or adjusted under 35 U.S.C. 154(b) by 218 days.

(21) Appl. No.: 10/584,032

(22) PCT Filed: Dec. 7, 2004

(86) PCT No.: PCT/JP2004/018548

§ 371 (c)(1), (2), (4) Date: Apr. 11, 2007

(87) PCT Pub. No.: WO2005/062368

PCT Pub. Date: Jul. 7, 2005

(65) Prior Publication Data

US 2007/0216021 A1   Sep. 20, 2007

(30) Foreign Application Priority Data

Dec. 22, 2003 (JP) .............................. 2003-424821

(51) Int. Cl.
*H01L 21/31* (2006.01)
(52) U.S. Cl. ...................................... 438/781; 524/268
(58) Field of Classification Search ................ 438/781, 438/780, 778; 524/268
See application file for complete search history.

(56) References Cited

U.S. PATENT DOCUMENTS 4,064,027 A   12/1977   Gant
4,293,671 A   10/1981   Sasaki et al.

(Continued)

FOREIGN PATENT DOCUMENTS

EP   0596534 A2   11/1994

(Continued)

OTHER PUBLICATIONS

English language abstract for JP8244064 extracted from espacenet.com database Aug. 14, 2006.

(Continued)

*Primary Examiner*—Walter L Lindsay, Jr.
*Assistant Examiner*—Reema Patel
(74) *Attorney, Agent, or Firm*—Howard & Howard Attorneys PLLC

(57) ABSTRACT

A method of manufacturing a semiconductor device sealed in a cured silicone body by placing a semiconductor device into a mold and subjecting a curable silicone composition that fills the spaces between said mold and said semiconductor device to compression molding, wherein the curable silicone composition comprises the following components: (A) an organopolysiloxane having at least two alkenyl groups per molecule; (B) an organopolysiloxane having at least two silicon-bonded hydrogen atoms per molecule; (C) a platinum-type catalyst; and (D) a filler, wherein either at least one of components (A) and (B) contains a T-unit siloxane and/or Q-unit siloxane. By the utilization this method, a sealed semiconductor device is free of voids in the sealing material, and a thickness of the cured silicone body can be controlled.

13 Claims, 4 Drawing Sheets

U.S. PATENT DOCUMENTS

| | | | |
|---|---|---|---|
| 5,571,853 A * | 11/1996 | Ikeno et al. ................ 524/268 |
| 6,509,423 B1 | 1/2003 | Zhu | |
| 6,518,204 B2 * | 2/2003 | Yamakawa et al. .......... 438/780 |
| 6,743,389 B2 | 6/2004 | Miyajima et al. | |
| 2002/0015748 A1 | 2/2002 | Miyajima et al. | |

FOREIGN PATENT DOCUMENTS

| | | |
|---|---|---|
| EP | 0789057 A1 | 8/1997 |
| JP | 8244064 | 9/1996 |
| JP | 11077733 | 2/1999 |
| JP | 2000277551 | 10/2000 |

OTHER PUBLICATIONS

English language abstract for JP11077733 extracted from espacenet.com database Aug. 14, 2006.

English language abstract for JP2000277551 extracted from espacenet.com database Feb. 18, 2007.

* cited by examiner

SEMICONDUCTOR DEVICE AND METHOD OF MANUFACTURING THEREOF

RELATED APPLICATIONS

This application claims priority to and all the advantages of International Patent Application No. PCT/JP2004/018548, filed on Dec. 7, 2004, which claims priority to Japanese Patent Application No. JP 2003-424821, filed on Dec. 22, 2003.

TECHNICAL FIELD

This invention relates to a method of manufacturing a semiconductor device and to a semiconductor device produced by the method.

BACKGROUND ART

Sealing of semiconductor devices is carried out with the use of a transfer-molding with a metal mold, potting with a liquid sealing resin, or screen-printing with a liquid sealing resin. The recent trend towards miniaturization of semiconductor devices demands that electronic devices be smaller in size, thinner in thickness, and allow resin sealing of packages as thin as 500 µm or thinner.

If a transfer-molding is employed in resin sealing of thin packages, the thickness of the sealing resin could be precisely controlled, whereas there are problems that vertical displacements of semiconductor chips occur in a flow of a liquid sealing resin, or breakage of wires and contact between the wires occur because of deformations of bonding wires connected to semiconductor chips under the effect of pressure in the flow of the liquid sealing resin.

On the other hand, although potting or screen-printing with a liquid sealing resin to some extent protects the bonding wires from breakage and mutual contact, these methods make accurate control of sealing-resin coatings more difficult and can easily lead to formation of voids.

It was proposed to solve the above problems and to manufacture a resin-sealed semiconductor device by placing an unsealed semiconductor device into a mold, filling spaces between the semiconductor device and the mold with a moldable resin, and curing the resin by using compression-molding (see Japanese Laid-Open Patent Application Publication (Kokai) (hereinafter referred to as "Kokai") Hei 8-244064, Kokai Hei 11-77733, and Kokai 2000-277551).

However, due to thinning of semiconductor chips that occurs with miniaturization of semiconductor elements, these methods increase warping of the semiconductor chips and printed-circuit boards and may lead to damaging of semiconductor devices and to worsening of their performance characteristics.

It is an object of the present invention to provide a method for efficient manufacturing of sealed semiconductor devices that prevents formation of voids in the sealing material, allows precise control of thickness of the cured silicone bodies that seal the devices, protects the bonding wires from disconnection and undesired contact, and reduces warping of semiconductor chips and printed-circuit boards. In particular, it is an object of the invention to provide such a method of manufacturing sealed semiconductor devices that allows compression molding of a curable silicone composition at relatively low temperatures required for reducing warping of semiconductor chips and printed-circuit boards. Still another object is to provide sealed semiconductor devices that possess the aforementioned properties.

DISCLOSURE OF INVENTION

The above objects are achieved by means of the present invention that provides a method of manufacturing a semiconductor device sealed in a cured silicone body by placing a semiconductor device into a mold and subjecting a curable silicone composition that fills the spaces between the mold and the semiconductor device to compression molding, wherein the aforementioned curable silicone composition comprises the following components: (A) an organopolysiloxane having at least two alkenyl groups per molecule; (B) an organopolysiloxane having at least two silicon-bonded hydrogen atoms per molecule; (C) a platinum-type catalyst; and (D) a filler, wherein either aforementioned component (A) contains siloxane units of formula $RSiO_{3/2}$ (where R is a univalent hydrocarbon group) and/or siloxane units of formula $SiO_{4/2}$, or aforementioned component (B) contains siloxane units of formula $R'SiO_{3/2}$ (where R' is a hydrogen atom or a univalent hydrocarbon that is free of aliphatic unsaturated carbon-carbon bonds) and/or siloxane units of formula $SiO_{4/2}$, or any of components (A) and (B) contains aforementioned siloxane units.

In addition, the invention also provides a semiconductor device produced by the aforementioned method.

EFFECTS OF THE INVENTION

The method of the invention provides efficient manufacturing of sealed semiconductor devices, prevents formation of voids in the sealing material, allows precise control of thickness of the cured silicone bodies that seal the devices, protects the bonding wires from disconnection and undesired contact, and reduces warping of semiconductor chips and printed-circuit boards. In particular, the invention provides such a method of manufacturing sealed semiconductor devices that allows compression molding of a curable silicone composition at the relatively low temperature required for reducing warping of semiconductor chips and printed-circuit boards. Furthermore, the invention provides sealed semiconductor devices that possess the aforementioned properties.

REFERENCE NUMBERS

Figure 1:
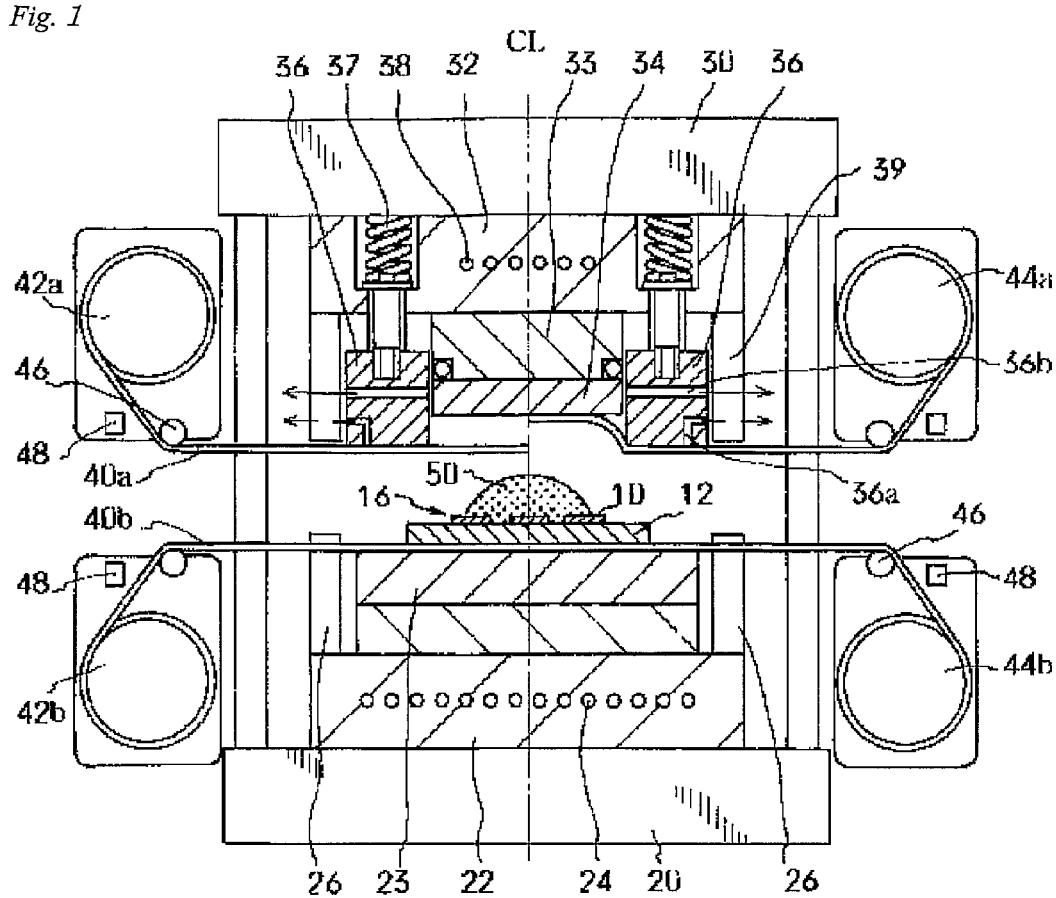
FIG. 1 illustrates main structural units of compression molding machine suitable for realization of the method of the present invention.

10: semiconductor chip
12: printed-circuit board
16: semiconductor device
20: fixed platen 22: lower base
23: lower mold
24: heater
26: lower clamp stopper
30: movable platen
32: upper base
33: upper holder
34: upper mold
34a: recess of the cavity
36: clamper
36a, 36b: airports
37: spring
38: heater
39: upper clamp stopper
40a, 40b: release films
42a, 42b: feed rollers
44a, 44b: take-up rollers
46: guide roller
48: static charge remover
50: curable silicone composition
70: semiconductor device sealed with a cured silicone body
72: cured silicone body

DETAILED DESCRIPTION ON THE INVENTION

Let us first consider in more detail a method of the invention for manufacturing sealed semiconductor devices.

The method of the invention comprises 1) placing an unsealed semiconductor device into a mold, 2) filling in spaces between the mold and the semiconductor device with a curable silicone composition, 3) subjecting the aforementioned curable silicone composition to compression molding. A press-molding machine with a mold suitable for realization of the method may be a conventional compression molding machine that comprises: a upper mold and a lower mold that form a mold cavity for accommodating the aforementioned semiconductor device and for filling this cavity with a curable silicone composition; a clamper for application of pressure; and a heater for curing the aforementioned curable silicone composition by heating. Examples of such pressure molding machines are described, e.g., in Kokai Hei 8-244064, Kokai Hei 11-77733, and Kokai 2000-277551. Among these, the machine disclosed in Kokai 2000-277551 is most preferable as it has a very simple construction.

More specifically, in the compression molding machine of Kokai 2000-277551, an unsealed semiconductor device is placed into a lower mold, then a curable silicone composition is fed to the space between the upper mold and the semiconductor device, the latter is clamped between the upper mold and lower mold, and the curable silicone composition is subjected to compression molding. The aforementioned compression molding machine is provided with a clamper which is formed into a frame-shape body that encloses side faces of the upper mold and is capable of sliding upward and downward in the opening and closing directions along the aforementioned side faces so that, when the mold is open and the lower end of the clamper is downwardly projected from the lower resin molding face of the upper mold, it is always biased downwardly. In cases where the upper mold and the lower mold come into direct contact with a curable silicone composition, it is recommended to coat the working surfaces of the mold with a fluoro-type resin. In particular, such compression molding machines are provided with feeding mechanisms for feeding films releasable from the mold and from the cured silicone body to the working position of the upper mold. Since in the aforementioned compression molding machine the semiconductor device is sealed through a release film, no resin is stuck on the resin molding face of the mold, the resin molding space is securely sealed by the release film, and molding can be carried out without forming resin flash.

The compression molding machine is also provided with another release-film feeding mechanism for a film peelable from the mold and the cured silicone body for feeding the aforementioned release film to cover a surface of the lower mold intended for supporting an unsealed semiconductor device. The machine is provided with a release film suction mechanism which fixes the release film on the lower end face of the clamper by air suction and fixes the release film on the inner surface of the mold space defined by the working surface of the upper mold and the inner surface of the clamper. This is achieved by sucking air from the inner bottom surface of the resin sealing area. Such an arrangement reliably holds the release film on the working surfaces of the mold. The release-film suction mechanism further comprises an air port open in the lower end face of the clamper and an air port open in an inner face of the clamper and communicating with an air channel formed between the inner surface of the clamper and the side surface of the upper mold. It is also possible to provide each aforementioned air port with an individual air-suction mechanism. The working surface of the upper mold may have cavities for molding separate elements that correspond to positions of semiconductor chips on the semiconductor device. Similarly, the working surface of the lower mold also may have cavities for molding separate elements that correspond to positions of semiconductor chips on the semiconductor device. The upper mold is capable of moving in the mold opening and closing directions and is biased toward the lower mold. The lower mold has in its working surface an overflow cavity for accumulating the curable silicone composition overflowed from the resin molding space when the semiconductor device is subjected to sealing. The machine is also provided with a gate channel that connects the overflow cavity with the sealing area in the clamping surface of the clamper that is pressed against the semiconductor device.

In operation, an unsealed semiconductor device is placed into the lower mold, a curable silicone composition is fed into the space between the upper mold and the aforementioned semiconductor device, the resin molding area is coated with a film peelable from the mold and the cured silicone body, and the semiconductor device, together with the curable silicone composition, is clamped between the upper mold and the lower mold. At this moment, the clamper moves along the side faces of the molding zone in the direction of mold opening and closing and is biased downward to the upper mold so as to project the lower end thereof below the resin molding face of the upper mold. Then the clamper comes into contact with the semiconductor device, the periphery of the sealing zone is sealed, and while the upper mold and the lower mold are gradually moved towards each other, the curable silicone composition fills the molding space. The clamper encloses the resin molding space in frame-like manner that during the clamping operation. The movement of the upper mold and the lower mold is discontinued at a clamping position, and, as a result, the molding space is fully filled with the curable silicone composition, and sealing of the semiconductor device is completed.

FIG. 1 illustrates main structural units of a compression molding machine suitable for realization of the method of the present invention. In this drawing, reference numeral 20 designates a fixed platen, 30 is a movable platen. Both platens are connected to and supported by a press unit. The press unit may be electrically or hydraulically driven and performs a sealing operation by moving the movable platen 30 in a vertical direction.

Reference numeral 22 designates a lower base, which is connected to the fixed platen 20. A setting section is formed in an upper face of a lower mold 23. An unsealed semiconductor device 16 to be sealed by the method of the present invention comprises a printed-circuit board 12 and a plurality of semiconductor chips 10, which are spaced from each other and are arranged on the printed-circuit board 12 in the longitudinal and transverse directions. The unsealed semiconductor devices 16 are placed into the lower mold 23. Reference numeral 24 designates heaters attached to the lower base 22. The heaters 24 heat the lower mold 23 and the unsealed semiconductor device 16 set in the lower mold 23. Reference numeral 26 designates lower clamp stoppers, which are installed in the lower base 22 and define clamping positions of the upper mold 34 top and the lower mold 23.

An upper base 32 is fixed to the movable platen 30. The device contains an upper holder 33, which is fixed to the upper base 32. The upper mold 34 is fixed to the upper holder 33. In the present embodiment of the method of the invention, the semiconductor chips 10 are provided on one side face of the printed-circuit board 12, and the semiconductor chips 10 in the printed-circuit board 12 are sealed and made flat on the sealed surface. For this purpose, the working surface of the upper mold 34 is also made flat over the entire surface of the sealing zone. A clamper 36 provided in the device is formed into a frame-shaped configuration and encloses side faces of the upper mold 34 and the upper holder 33. The clamper 36 is attached to the upper base 32 and is capable of vertically moving with respect thereto. Normally, the clamper 36 is biased toward the lower mold 23 by springs 37. The working surface of the upper mold 34 is slightly withdrawn from the edge of the clamper 36, so that a sealing zone is formed between the inner face of the clamper 36 and the working surface of the upper mold 34 in the closed position of the mold. The clamper 36 may be biased by means other than the spring 37, e.g., by an air cylinder or the like.

Reference numeral 38 designates heaters attached to the upper base 32. The heaters 38 heat the upper mold 34 and the upper holder 33 so that the semiconductor device 16 is heated when the mold is closed. The device is provided with upper clamp stoppers 39, which are installed in the upper base 32. The upper clamp stoppers 39 and the lower clamp stoppers 26 are aligned with each other so that, when the mold is closed, the mating end faces of the stoppers come into mutual contact. When the movable platen 30 is moved downward by the press unit, the upper clamp stoppers 39 contact the lower clamp stoppers 26 at the clamping position of the mold. The thickness of the cured silicone body layer in the sealing zone is defined by the aforementioned clamping position.

Reference numerals 40a and 40b designate release films which are formed as elongated belts having a width suitable for covering the working areas of the upper mold 34 and lower mold 23. The release films are used for coating the sealing surfaces of the working zone so as to exclude direct contact of the working surfaces of the mold with the curable silicone composition. The release films 40a and 40b are made of a soft material having a uniform strength and easily deformable in order to cover the recesses and projections on the working surfaces of the mold. At the same time, the material of the films should possess thermal resistance sufficient to withstand molding temperatures and should be easily peelable from the cured silicone body and the mold. Examples of such films are films made from polytetrafluoroethylene (PTFE) resin, a copolymer of ethylene and tetrafluoroethylene (ETFE), a copolymer of tetrafluoroethylene and perfluoropropylene (FEP), polyvinylidenefluoride resin, or similar fluoro-resin films; polyethyleneterephthalate (PET) resin films and polypropylene films (PP).

If only one side of the printed-circuit board 12 is sealed by the method of the present invention, the film, which is brought into contact with the curable silicone composition, is the release film 40a that is fed to the upper mold 34. Additional feeding of the release film 40b to the working surface of the lower mold 23 will improve reliability of sealing and exclude formation of flashes by effectively absorbing non-uniformities in the thickness of the printed-circuit board 12 due to compressibility and elasticity of the release film 40b. In principle, however, sealing can be carried out with the supply only of the release film 40a to the upper mold 34 alone.

Reference numerals 42a and 42b designate feeding rollers for feeding release films 40a and 40b, while 44a and 44b designate take-up rollers for the release films 40a and 40b. As shown in the drawing, the film feeding rollers 42a, 42b and film take-up rollers 44a, 44b are located on opposite sides of the mold. The film feeding roller 42a of the upper mold and the take-up roller 44a are attached to the movable platen 30, while the film feeding roller 42b and the film take-up roller 44b are attached to the fixed platen 20. In such an arrangement, the release films 40a and 40b move from one side to the other side of the mold. The film feeding roller 42a and the take-up roller 44a of the upper mold are vertically moved together with the movable platen 30. Reference numeral 46 designates guide rollers, and 48 designates static charge removers, namely, ionizers, that remove electrostatic charge from the release films 40a and 40b.

The release film 40a fed to the upper mold 34 is fixed onto the upper mold 34 and held by air suction. The clamper 36 has air ports 36a that are opened in the lower end face of the clamper 36 and air ports 36b opened in the inner side surfaces of the clamper 36. The air ports 36a are connected to a suction unit located outside the mold. A seal ring is installed in the upper holder 33 on the sliding inner surface of the clamper to prevent leakage when air is sucked through the air ports 36b. A space is formed between the side faces of the upper mold 34, side faces of the upper holder 33, and inner faces of the clamper 36 for an air channel, so that under the effect of suction of air through the air ports 36b the release film 40a can be applied and fixed onto the inner surfaces of the molding zone, which is formed by the upper mold 34 and the clamper 36. In addition to the suction action, the suction unit connected to the air ports 36a and 36b may generate compressed air. Supply of compressed air to the air ports 36a and 36b will facilitate separation of the release film 40a from the working surfaces of the mold.

The following is a description of the method of the invention for sealing a semiconductor device with the use of the above-described mold. In FIG. 1, in the side of the mold to the left from the center line CL, the movable platen 30 is shown in an open state, in which it is located at its uppermost position. In this state, the release films 40a and 40b are newly fed onto the working surfaces of the mold, while a semiconductor device 16 is placed into the lower mold 23. The semiconductor device 16 is laid onto the release film 40b that covers the surface of the lower mold 23.

In FIG. 1, the side of the mold to the right from the center line CL shows a state, in which the release film 40a is attached by suction to the upper mold 34 and the lower end face of the clamper 36. The release film 40a is fed to the working surface of the mold, the air is sucked through the air ports 36a and 36b, the release film 40a is placed and fixed onto the lower end face of the clamper 36, and at the same time the release film 40a is fitted and fixed on the inner surfaces of the clamper 36 and the working surface of the upper mold 34. Since the release film 40a is sufficiently soft and stretchable, under effect of suction it can tightly fit to recesses on the inner surface of the clamper 36 and the working surface of the upper mold 34. The air ports 36a on the end face of the clamper 36 are spaced from each other at predetermined distances and distributed over periphery of the upper mold 34.

The release film 40a is fixed by air suction on the upper mold 34. A curable silicone composition 50 is supplied onto the printed-circuit board 12 of the semiconductor device 16. It is recommended to supply the curable silicone composition in an amount corresponding to the inner volume of the sealing space by using a dispenser or a similar dosing device.

Figure 2:
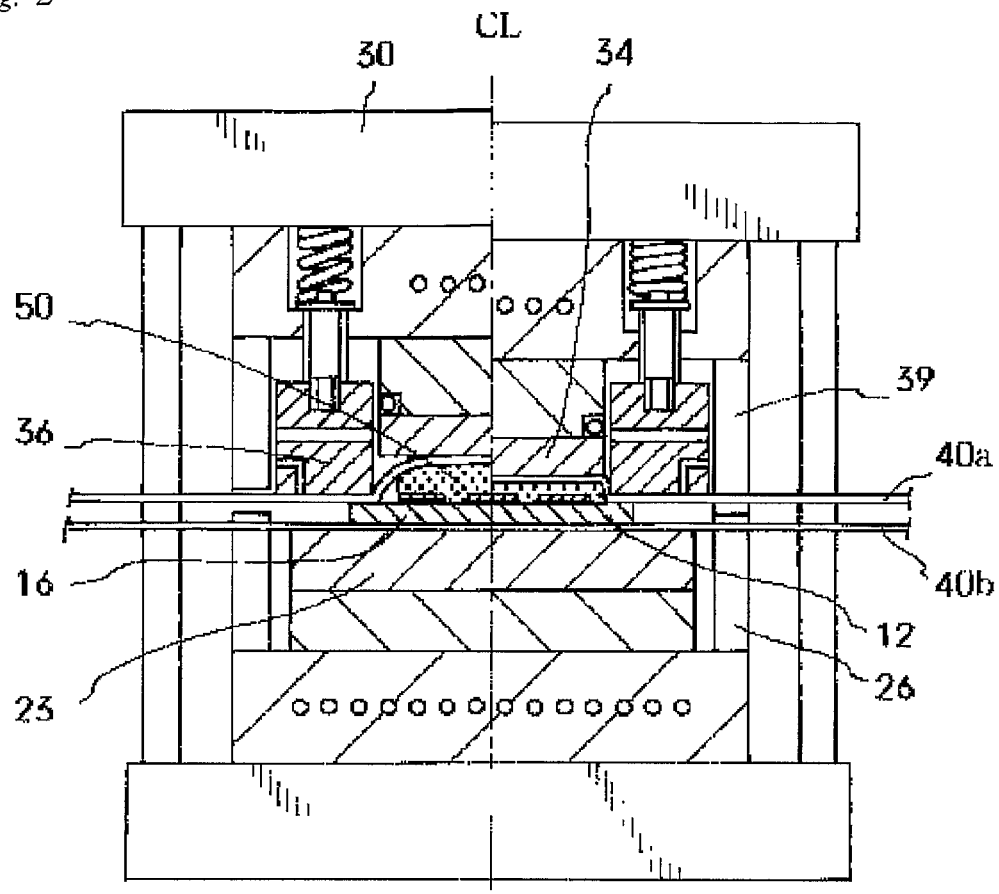
FIG. 2 illustrates sealing conditions of a semiconductor device sealed with the use of a compression molding machine utilized for realization of the method of the invention.

FIG. 2 illustrates the mold in the state where the semiconductor device 16 is clamped between the upper mold 34 and the lower mold 23. The part of the mold that is shown in this drawing to the left from the center line CL illustrates the state, in which the upper mold 34 is moved downward and the lower end face of the clamper 36 is pressed against the printed-circuit board 12 of the semiconductor device 16. The upper mold 34 did not yet reach the position of complete clamping, but since the periphery of the molding space is closed and sealed by the clamp 36, the curable silicone composition 50 is compressed by the upper mold 34 and begins to fill the molding space. In FIG. 2, the parts on the right side of the center line CL are shown with the upper mold 34 shifted downward to the final clamping position. In this position, the end faces of the upper clamp stoppers 39 are in contact with the end faces of the lower clamp stoppers 26. The clamping force moves the clamper 36 upward against the elasticity of the springs 37, so that the curable silicone composition 50 in the molding space acquires a predetermined height.

By moving the upper mold 34 downward to the clamping position, the molding space is reduced to a desired height, and the curable silicone composition 50 used for sealing fills the entire molding space. As shown in FIG. 2 on the left from the center line CL, a small gap is still left between the release film 40a and the corner of the upper mold 34. However, this gap disappears when the upper mold 34 descends to the lowermost position, so that the curable silicone composition 50 completely fills the entire molding space.

Since the periphery of the molding space is closed and reliably sealed by the clamper 36 via the release film 40a, no leakage occurs from the molding space. In the case where small steps are formed on the surface of the printed-circuit board 12, e.g., by wire patterns, these small projections can be absorbed by pressing via the release film 40a, so that no curable silicone composition leaks outside the molding space when the mold is in a clamped state. Due to its resiliency in the thickness direction, the release film 40b on the lower side of the printed-circuit board 12 also can absorb deviations in the thickness of the semiconductor device 16 and thus further contribute to reliability of sealing.

After the mold is closed and the curable silicone composition 50 is cured, the mold is opened and the sealed semiconductor device 70 is removed from the mold. Since sealing was carried out through the release films, the curable silicone composition 50 does not stick to the working surfaces of the mold. The release films 40a and 40b can be easily peeled off from the mold, so that the sealed semiconductor device 70 can be easily removed from the open mold. Separation of the release film 40a from the working surfaces of the mold can be facilitated by blowing air through the air-ports 36a and 36b. After the mold is open, the feed rollers 42a, 42b and the take-up rollers 44a and 44b are activated, and the release films 40a and 40b are removed from the mold together with the sealed semiconductor device 70.

Figure 3:
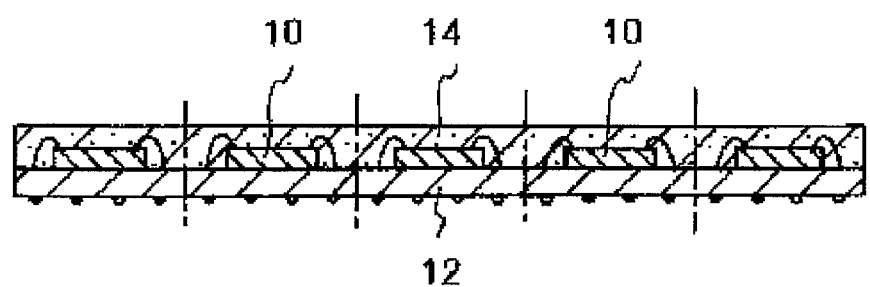
FIG. 3 is a sectional view of a semiconductor device produced in accordance with Practical Examples 1 and 2.
Figure 4:
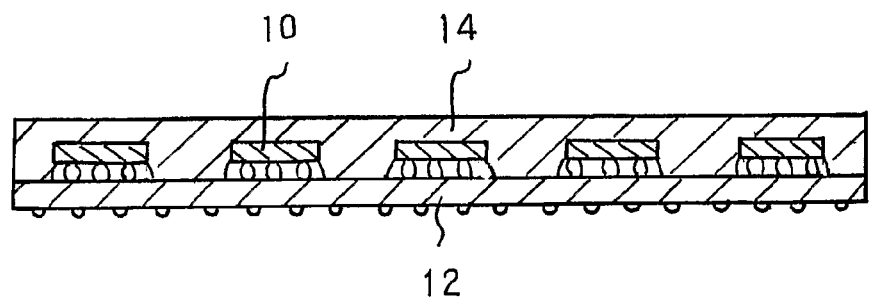
FIG. 4 is a sectional view of a semiconductor device of the invention.
Figure 5:
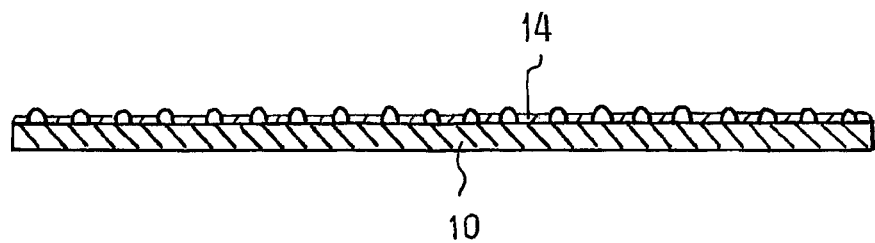
FIG. 5 is another sectional view of a semiconductor device of the invention.

Semiconductor devices 70 sealed by the method of the present invention are shown in FIGS. 3, 4, and 5. Since the upper mold 34 has a flat working surface, the upper face of the sealed product is also made flat. Individual sealed semiconductor devices are obtained by cutting the printed-circuit board along the center lines shown in the drawings between the neighboring semiconductor chips 10. Cutting can be carried out by a dicing saw, a laser cutter, etc.

Figure 6:
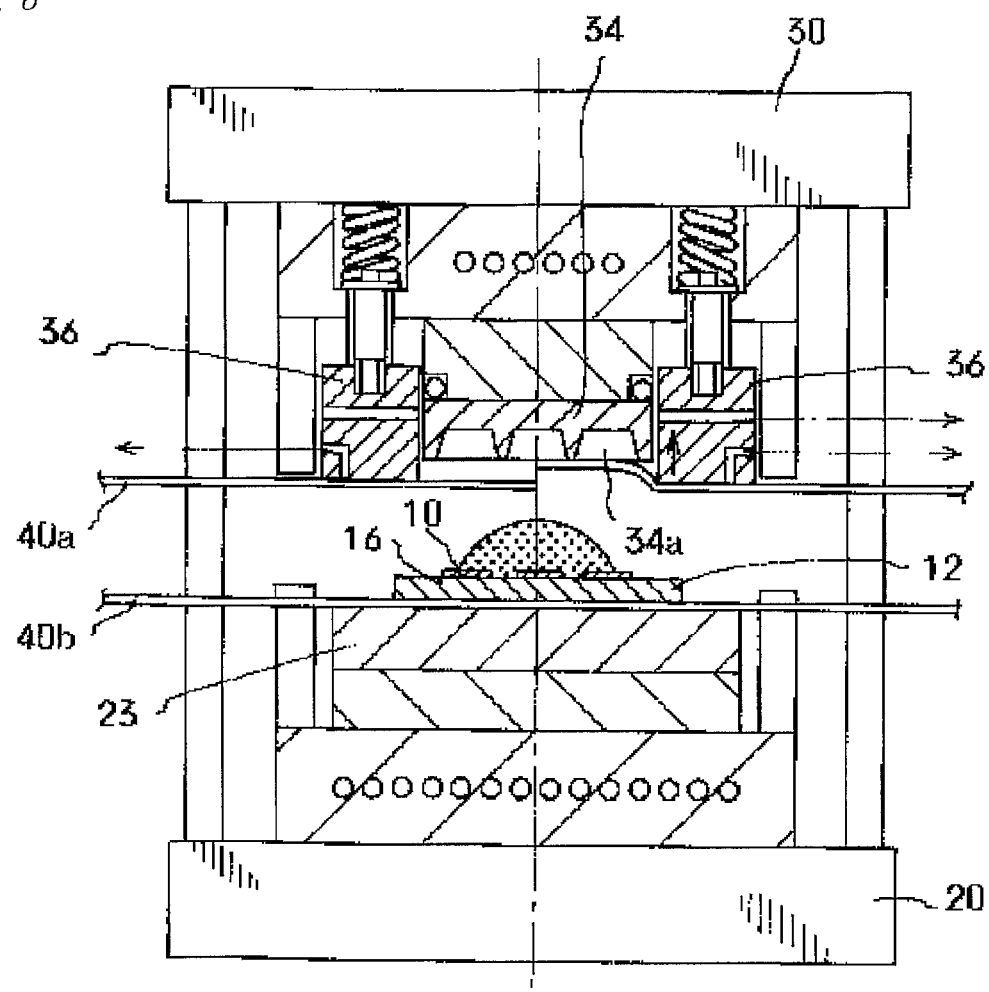
FIG. 6 illustrates another structure of the compression molding machine suitable for realization of the method of the invention.

As shown in FIG. 6, in accordance with the method of the present invention, a plurality of cavities 34a that correspond to positions of respective semiconductor chips 10 on the printed-circuit board 12 are formed in the working surface of the upper mold 34. In other words, each semiconductor chip 10 can be sealed in the individual cavity 34a.

Figure 7:
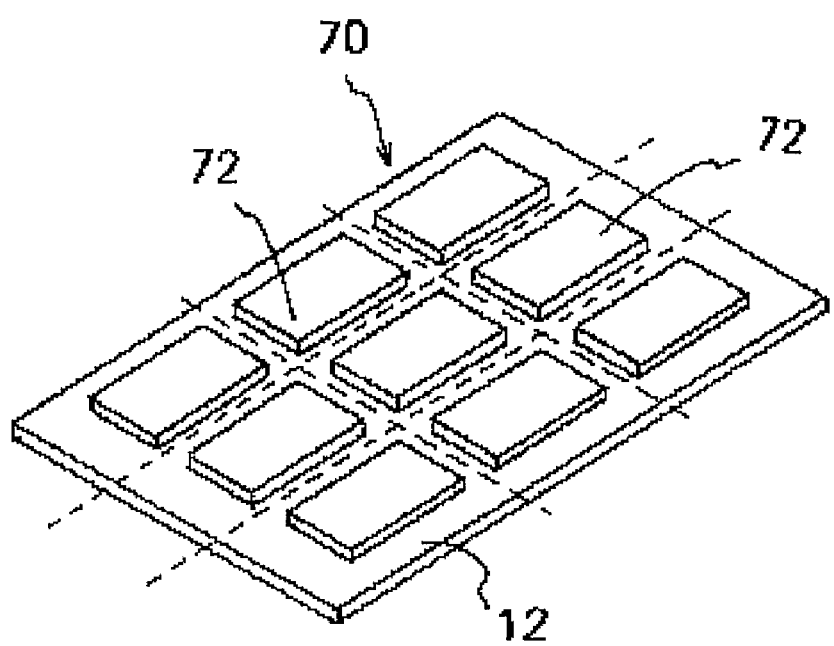
FIG. 7 is an example of a three-dimensional view of a semiconductor device of the invention.

Semiconductor chips sealed with cured silicone body 70 by the above method are shown in FIG. 7. Such semiconductor devices 70 also can be separated into individual products by cutting through the cured silicone body 72 and the printed-circuit board along the lines between the adjacent semiconductor chips. Cutting can be carried out by a dicing saw, a laser cutter, etc.

A curable silicone composition that is used in the method of the present invention is comprised of the following components: (A) an organopolysiloxane having at least two alkenyl groups per molecule; (B) an organopolysiloxane having at least two silicon-bonded hydrogen atoms per molecule; (C) a platinum-type catalyst; and (D) a filler, wherein either the component (A) contains siloxane units of formula $RSiO_{3/2}$ (where R is a univalent hydrocarbon group) and/or siloxane units of formula $SiO_{4/2}$, or the component (B) contains siloxane units of formula $R'SiO_{3/2}$ (where R' is a hydrogen atom or a univalent hydrocarbon that is free of aliphatic unsaturated carbon-carbon bonds) and/or siloxane units of formula $SiO_{4/2}$, or any of components (A) and (B) contains the aforementioned siloxane units.

Component (A) of the above composition is an organopolysiloxane that contains at least two alkenyl groups per molecule. The alkenyl groups of component (A) may be represented by vinyl groups, allyl groups, butenyl groups, pentenyl groups, hexenyl groups, and heptenyl groups, of which the vinyl groups are most preferable. Bonding positions of the alkenyl groups in component (A) may be located at molecular terminals and/or on molecular-chain sides. Silicon-bonded groups other than alkenyl that may be contained in component (A) may be comprised of methyl groups, ethyl groups, propyl groups, butyl groups, pentyl groups, hexyl groups, heptyl groups, or similar alkyl groups; phenyl groups, tolyl groups, xylyl groups, naphthyl groups, or similar aryl groups; benzyl groups, phenethyl groups, or similar aralkyl groups; chloromethyl groups, 3-chloropropyl groups, 3,3,3-trifluoropropyl groups, or similar halogenated alkyl groups. Of these, most preferable are methyl groups and phenyl groups. Component (A) may have a linear, branched, cyclic, net-like, or partially-branched linear structure. It is recommended to have the branched or partially-branched linear structure with siloxane units of formula $RSiO_{3/2}$ (T-unit siloxane) and/or siloxane units of formula $SiO_{4/2}$ (Q-unit siloxane). In these formulae, R designates univalent hydrocarbon groups more specifically exemplified by the aforementioned alkyl groups, alkenyl groups, aryl groups, aralkyl groups, and halogenated alkyl groups. There are no special restrictions with regard to viscosity of component (A) at 25° C. However, for better mechanical strength of the cured silicone body and handling conditions of the curable silicone composition, it is recommended to have a viscosity within the range of 50 to 500,000 mPa·s, preferably within the range of 400 to 100,000 mPa·s. When component (A) is composed of siloxane units of formula $RSiO_{3/2}$ and/or siloxane units of formula $SiO_{4/2}$, its weight-average molecular weight as converted to standard polystyrene should be equal to or higher than 1,500.

Aforementioned component (A) may be exemplified by the following compounds:

a copolymer of methylvinylsiloxane and dimethylsiloxane having both molecular terminals capped with trimethylsiloxy groups, a methylvinylpolysiloxane having both molecular terminals capped with trimethylsiloxy groups, a copolymer of methylphenylsiloxane, methylvinylsiloxane, and dimethylsiloxane having both molecular terminals blocked with trimethylsiloxy groups, a dimethylpolysiloxane having both molecular terminals capped with dimethylvinylsiloxy groups, methylvinylpolysiloxane having both molecular terminals capped with dimethylvinylsiloxy groups, a copolymer of methylvinylsiloxane and dimethylsiloxane having both molecular terminals capped with dimethylvinylsiloxy groups, a copolymer of methylphenylsiloxane, methylvinylsiloxane, and dimethylsiloxane having both molecular terminals capped with dimethylvinylsiloxy groups, an organopolysiloxane copolymer composed of siloxane units represented by the following formulae: $R^1_3SiO_{1/2}$, $R^1_2R^2SiO_{1/2}$, and $SiO_{4/2}$; an organopolysiloxane copolymer composed of siloxane units represented by the following formulae: $R^1_2R^2SiO_{1/2}$, and $SiO_{4/2}$; an organopolysiloxane copolymer composed of siloxane units represented by the following formulae: $R^1R^2SiO_{2/2}$, and $R^1SiO_{3/2}$; an organopolysiloxane copolymer composed of siloxane units represented by the following formulae: $R^1R^2SiO_{2/2, and R}{}^2SiO_{3/2}$; or mixture of two or more of the aforementioned organopolysiloxanes. In the above formulae, $R^1$ may represent univalent hydrocarbon groups other than alkenyl groups, such as aforementioned alkyl groups, aryl groups, aralkyl groups, and halogenated alkyl groups. Furthermore, in the above formulae, $R^2$ may represent alkenyl groups similar to those listed above.

Component (B) is an organopolysiloxane having at least two silicon-bonded hydrogen atoms per molecule. Bonding positions of silicon-bonded hydrogen atoms in component (B) may be located on molecular terminals and/or on the molecular-chain sides. Silicon-bonded groups of component (B) may be exemplified by univalent hydrocarbon groups that are free of aliphatic unsaturated carbon-carbon bonds, such as the aforementioned alkyl groups, aryl groups, aralkyl groups, and halogenated alkyl groups. The methyl and phenyl groups are most preferable. Component (B) may have a linear, branched, cyclic, net-like, or a partially-branched linear molecular chain structure. Most preferable are branched- or partially-branched linear structures composed of siloxane units (T-unit siloxane) of formula $R'SiO_{3/2}$ and/or siloxane units (Q-unit siloxanes) of $SiO_{4/2}$ formula. In the above formula, $R'$ represents hydrogen atoms or univalent hydrocarbon groups free of aliphatic unsaturated carbon-carbon bonds, such as the aforementioned alkyl groups, aryl groups, aralkyl groups, and halogenated alkyl groups. When component (A) is composed of siloxane units of formula $RSiO_{3/2}$ and/or siloxane units of formula $SiO_{4/2}$, (B) component should preferably have a linear or a partially-branched linear molecular-chain structure. There are no special restrictions with regard to viscosity of component (B) at 25° C. However, for better mechanical strength of the cured silicone body and handling conditions of the curable silicone composition, it is recommended to have a viscosity within the range of 5 to 100,000 mPa·s. When component (B) is composed of siloxane units of formula $R'SiO_{3/2}$ and/or siloxane units of formula $SiO_{4/2}$, its weight-average molecular weight in terms of standard polystyrene should be equal to or higher than 1,500.

Aforementioned component (B) may be exemplified by the following compounds:

a methylhydrogenpolysiloxane having both molecular terminals capped with trimethylsiloxy groups, a copolymer of methylhydrogenpolysiloxane and dimethylsiloxane having both molecular terminals capped with trimethylsiloxy groups, a copolymer of methylphenylsiloxane, methylhydrogensiloxane, and dimethylsiloxane having both molecular terminals blocked with trimethylsiloxy groups, a dimethylpolysiloxane having both molecular terminals capped with dimethylhydrogensiloxy groups, a copolymer of methylphenylsiloxane and dimethylsiloxane having both molecular terminals capped with dimethylhydrogensiloxy groups, a methylphenylpolysiloxane having both molecular terminals capped with dimethylhydrogensiloxy groups, an organopolysiloxane copolymer composed of siloxane units represented by the following formulae: $R^1_3SiO_{1/2}$, $R^1_2HSiO_{1/2}$, and $SiO_{4/2}$; an organopolysiloxane copolymer composed of siloxane units represented by the following formulae: $R^1_2HSiO_{1/2}$, and $SiO_{4/2}$; an organopolysiloxane copolymer composed of siloxane units represented by the following formulae: $R^1HSiO_{2/2}$, and $R^1SiO_{3/2}$; an organopolysiloxane copolymer composed of siloxane units represented by the following formulae: $R^1HSiO_{2/2}$, and $HSiO_{3/2}$; or mixture of two or more of the aforementioned organopolysiloxanes. In the above formulae, $R^1$ may represent univalent hydrocarbon groups other than alkenyl groups, such as those mentioned above.

In the composition of the invention, component (B) should be used in an amount sufficient for curing the composition. In order to ensure sufficient curing without decrease of mechanical strength, component (B) should be used in an amount of 0.1 to 100 parts by weight for each 100 parts by weight of component (A).

Component (C) is a platinum-type catalyst that promotes curing of the composition of the invention. The following are specific examples of such a catalyst: platinum fine powder, platinum black, fine powder of platinum on a silica carrier, fine powder of platinum on an active carbon, chloroplatinic acid, platinum tetrachloride, an alcohol solution of a chloroplatinic acid, a platinum-olefin complex, a platinum-alkenylsiloxane complex, and thermoplastic resin powders that contain the aforementioned platinum-type catalysts and have dimensions of particles not exceeding 10 μm. The thermoplastic resins are exemplified by polystyrene resins, Nylon resins, polycarbonate resins, and silicone resins.

In the composition of the invention, component (C) should be used in an amount sufficient for promoting curing of the composition. In particular, in the present composition, it is preferable to use it in such a quantity that the amount of metallic platinum contained in this component, in weight units, stays in the range of 0.1 to 500 ppm, more preferably, in the range of 1 to 50 ppm.

Component (D) is a filler that is added to the composition for improving mechanical strength or physical properties of the cured silicone body. Such a filler may be comprised of fumed silica, precipitated silica, titanium dioxide, or similar reinforcement fillers; alumina, quartz powder, silicon nitride, boron nitride, aluminum nitride, or a similar thermoconductive filler; gold, silver, copper, metal-plated resin powder, or a similar electroconductive filler; glass fiber, carbon fiber, titanium whiskers, or a similar fiber-like filler; silicone resin powder, Nylon resin powder, acrylic resin powder, or a similar filler made from an organic resin; or the aforementioned fillers surface-treated with organosilicon compounds such as organoalkoxysilane, organochlorosilane, organosilazane, etc.

There are no special limitations with the regard to the amount in which component (D) should be used in the composition of the present invention. From the point of view of sufficient mechanical strength or physical properties in a cured silicone body obtained from the composition of the invention, it is recommended to add component (D) in an amount equal to or exceeding 60 wt. %.

The composition may incorporate some optional curing inhibitors that may be required for improving storage stability and composition handling conditions. Such inhibitors can be represented by 2-methyl-3-butyn-2-ol, 3,5-dimethyl-1-hexyn-ol, 2-phenyl-3-butyn-2-ol, or a similar alkyn alcohol; 3-methyl-3-penten-1-yn, 3,5-dimethyl-3-hexen-1-yn, or a similar en-yne compound; 1,3,5,7-tetramethyl-1,3,5,7-tetravinylcyclotetra-siloxane, 1,3,5,7-tetramethyl-1,3,5,7-tetrahexenyl-cyclotetrasiloxane, benzotriazole, etc. In the composition of the invention, the aforementioned curing inhibitors should be used, in weight units, in an amount of 10 to 50,000 ppm.

In order to improve adhesive properties of the composition, it may incorporate adhesion promoters. Such adhesive promoters may be comprised of organosilicon compounds different from components (A) and (B) with at least one silicon-bonded alkoxy group per molecule. The aforementioned alkoxy groups may be represented by methoxy groups, ethoxy groups, propoxy groups, butoxy groups, and methoxyethoxy groups, of which most preferable are the methoxy groups. Furthermore, the adhesion promoter may contain groups other than the silicon-bonded alkoxy groups of the aforementioned organosilicon compounds, e.g., substituted or unsubstituted univalent hydrocarbon groups such as the aforementioned alkyl groups, alkenyl groups, aryl groups, aralkyl groups, halogenated alkyl groups, etc.; 3-glycidoxypropyl groups, 4-glycidoxybutyl groups, or similar glycidoxyalkyl groups; 2-(3,4-epoxycyclohexyl)ethyl groups, 3-(3,4-epoxycyclohexy)propyl, or similar epoxycyclohexylalkyl groups; 4-oxysilanylbutyl groups, 8-oxysilanyloctyl groups, or similar oxysilanylalkyl groups, or other epoxy-containing univalent organic groups; 3-methacryloxypropyl groups, or similar acryl-group containing univalent organic groups; or hydrogen atoms. It is preferable that in the aforementioned adhesion promoter at least one group per molecule is comprised of the aforementioned epoxy-containing univalent hydrocarbon group, or the univalent organic group that contains acryl groups. It is recommended that the aforementioned organosilicon compounds have groups reactive with components (A) and (B). More specifically, these can be silicon-bonded alkenyl groups or silicon-bonded hydrogen atoms. For better adherence to various substrates, it is recommended to chose the aforementioned organosilicon compounds from those that contain univalent organic groups with at least one epoxy group per molecule. Examples of such organosilicon compounds are organosilane compounds and organosiloxanes oligomers. Such organosiloxanes oligomers may have a linear, partially-branched linear, branched, cyclic, or net-like molecular chain structure. The linear, branched, and net-like molecular chain structures are preferable. The aforementioned organosilicon compounds can be exemplified by 3-glycidoxypropyltrimethoxysilane, 2-(3,4-epoxycyclohexyl)ethyltrimethoxysilane, 3-methacryloxypropyltrimethoxysilane, or similar silane compounds; siloxane compounds that contain in one molecule at least one silicon-bonded alkenyl group, or a silicon-bonded hydrogen atom, or a silicon-bonded alkoxy group, a mixture of a silane compound having at least one silicon-bonded alkoxy group with a siloxane compound having in one molecule at least one silicon-bonded hydroxy group and a silicon-bonded alkenyl group; a siloxane compound of the following formula:

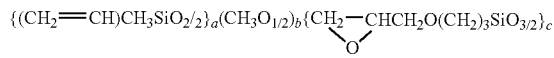

(where "a", "b", and "c" are positive numbers), and a siloxane compound of the following formula:

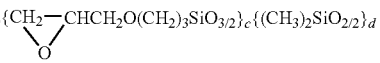

There are no special restrictions with regard to the amounts in which the adhesion promoters can be used, but it is recommended to use them in an amount of 0.01 to 10 parts by weight per 100 parts by weight of component (A).

Within the limits not detrimental to the objects of the invention, the composition may be combined with other optional components, such as carbon black or similar pigments; iron oxide or similar heat-resistant agents, dyes, flame retarding agents, lubricants, etc.

The composition may be comprised of one liquid or a mixture of two liquids, but for better curability and for curability at lower temperatures, it is recommended to prepare a two-liquid type composition composed of a composition comprising components (A), (C), (D) as main components without component (B), and another composition comprising components (B), (D) as main components without component (C). It is recommended that such two-liquid type compositions be stored as two separate liquids that are to be mixed during use or directly prior to use.

When the composition is of a two-liquid type, the liquids can be mixed directly prior to use by means of a planetary mixer, roller mixer, dental mixer, or another mixing device. Continuous mixing of two liquids during use can be carried out by means of a static mixer.

The curable silicone composition of the present invention can be used not only as a protective agent for protecting semiconductor chips and wiring, but also as insulating layers for semiconductor chips and printed-circuit boards, or as shock-absorbing layers for semiconductor chips and printed-circuit boards. There are no special restrictions with regard to the forms of cured silicone bodies, and they can be made in the form of soft rubber, hard rubber, resin, etc. In particular, it is recommended to provide a combined modulus of elasticity not exceeding 1 GPa.

Semiconductor devices that can be sealed with a cured silicone body by the method of the present invention can be exemplified by printed-circuit boards that mounts semiconductor chips, semiconductor chips prior to electrical interconnection, or semiconductor wafers prior to cuffing into individual semiconductor devices. Examples of such semiconductor devices are shown in FIGS. 3 and 4 that respectively illustrate a semiconductor device that consists of semiconductor chips on a printed-circuit board and a device that consists of wire bonded semiconductor chips and a printed-circuit board with a plurality of lead wires. In the embodiment of FIG. 3, the semiconductor devices are formed by wire bonding the semiconductor chips 10 with bonding wires made from gold or aluminum after the chips are secured by a bonding agent on a printed-circuit board 12 made from a polyimide resin, epoxy resin, BT resin, or ceramic. In the embodiment of a semiconductor device of FIG. 4, semiconductor chips are electrically interconnected with the printed-circuit board via the use of solder balls or conductive bumps. For reinforcement, the solder balls or conductive bumps may incorporate an underfill agent. Such an underfill agent may be comprised of a curable epoxy resin composition or a curable silicone composition. In the semiconductor devices of FIGS. 3 and 4, in order to connect the semiconductor devices after they have been sealed to other printed-circuit boards, the printed-circuit board 12 that supports these devices is provided, on the side opposite to the chips, with external electrodes, e.g., solder balls, formed on the back side of the printed-circuit board. If a device consists of a plurality of simultaneously sealed semiconductor chips arranged on the upper side of the board, the package can be divided into individual sealed semiconductor devices by sawing or by punching. FIG. 5 shows an example of a wafer level Chip Scale Package, namely, CSP.

When during sealing of a semiconductor device with a cured silicone body by the method of the invention in the above-described compression molding machine the curable silicone composition comes into direct contact with the mold, it leaves on the molding surfaces of the mold a slimy substance that adheres to these surfaces. Therefore, it is recommended to perform compression sealing via the aforementioned release films. The use of such films allows continuous sealing with resin, extends intervals between mold-cleaning operations, and thus increases production efficiency.

There are no special restrictions with regard to compression-molding conditions. However, for decreasing stress in circuit printed boards and semiconductor chips, it is recommended to maintain the heating temperature within the range of 60° C. to 130° C. Furthermore, preheating of the mold may improve a compression-molding cycle time. Spreading of the curable silicone composition depends on the type of the composition. However, spreading can be controlled by applying the composition dropwise onto a printed-circuit board preheated by the heat from the lower mold.

EXAMPLES

The method of manufacturing a semiconductor device and the semiconductor device of the invention will now be described in more detail with reference to practical and comparative examples. The procedures used for evaluating properties of the semiconductor devices are described below.

[Appearance and Filling]

Surfaces of the semiconductor device sealed with cured silicone bodies or cured epoxy resin body were observed with a naked eye and evaluated on the basis of criteria designated as follows: completely filled and smooth surface—○; the surface is partially non-smooth—Δ; no smoothness over the entire surface—X; edge portions are not filled—XX.

[Warping]

Warping was determined by rigidly fixing one long side of a semiconductor device assembly sealed by cured silicone bodies or cured epoxy resin body, prior to cutting it into individual semiconductor devices, and measuring the height of the other long side over the position of the fixed side.

[Cuttability]

This property was evaluated by cutting assemblies with semiconductor devices on a printed-circuit board sealed with cured silicone bodies into individual sealed semiconductor devices. Cutting was performed with the use of a sawing machine (a product of Disco Corporation; CS cutter, 15,000 rpm). The following criteria were used for evaluation: burrs do not exceed 10 μm—○; burrs are within the range of 10 to 25 μm—Δ; burrs exceed 25 μm—X; a plurality of burrs that exceed 25 μm—XX.

Hydrosilation-curable silicone rubber compositions with components listed below were prepared for use in the practical examples. Methods used for measuring viscosity and curability of the prepared silicone rubber compositions and methods used for measuring the composite modulus of elasticity and coefficient of thermal expansion are also given below.

[Starting Materials for Preparation of Silicone Rubber Compositions]

Organopolysiloxane (A-1): silicone resin having a weight-average molecular weight of 4,600 as converted to standard polystyrene, and represented by the following average composition formula:

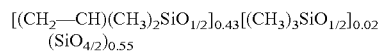

Organopolysiloxane (A-2): silicone resin having a weight-average molecular weight of 1,100 as converted to standard polystyrene, and represented by the following average composition formula:

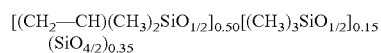

Organopolysiloxane (A-3): dimethylpolysiloxane with a viscosity of 40 Pa·s having both molecular terminals capped with a dimethylvinylsiloxy groups;

Organopolysiloxane (A-4): dimethylpolysiloxane with viscosity of 2,100 mPa·s having both molecular terminals capped with a dimethylvinylsiloxy groups;

Organopolysiloxane (B-1): methylhydrogenpolysiloxane with a viscosity of 40 mPa·s having both molecular terminals capped with trimethylsiloxy groups;

Platinum-type catalyst (C-1): 1,3-divinyl-1,1,3,3-tetramethyldisiloxane solution of a platinum-1,3-divinyl-1,1,3,3-tetramethyldisiloxane complex;

Filler (D-1): fine spherical silica powder with an average particle diameter of 0.5 μm;

Filler (D-2): fine spherical silica powder with an average particle diameter of 8 μm;

Filler (D-3): fine spherical alumina powder with an average particle diameter of 10 μm;

Filler (D-4): fumed silica with BET specific surface area of 200 m²/g;

Curing inhibitor: 2-phenyl-3-butyn-2-ol;

Adhesion promoter: siloxane compound represented by the following average unit formula:

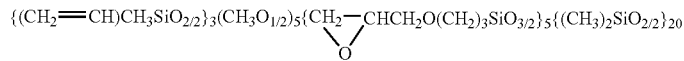

Pigment: carbon black.

[Viscosity of Silicone Rubber Composition]

Viscosity of silicone rubber compositions at 25° C. was measured by a BS-type rotary viscometer (the product of Tokimec Co.; model BS; Rotor No. 7; rotation frequency: 2.5 rpm).

[Curability of Silicone Rubber Compositions]

Curability of silicone rubber compositions was measured at various measurement temperatures (80° C., 100° C., and 120° C.) with the use of a curastometer (the product of JSR company). The time when the torque resulting from cross-linking after the mold was closed began to appear was measured as IP value (in seconds), and the time when the torque was 90% of the one that can be reached at the final curing was measured as T90 value (in seconds).

[Composite Modulus of Elasticity of Silicone Rubber]

A silicone rubber was produced by subjecting a silicone rubber composition to compression molding for 5 min. at 120° C. under load of 30 kgf/cm² and then again heat-treating the product at 120° C. for 1 hour in an oven. The composite modulus of elasticity was measured with the use of an instrument for measuring viscoelasticity (shear frequency 1 Hz, strain rate 0.5%).

[Coefficient of Thermal Expansion of Silicone Rubber]

Coefficient of thermal expansion of the silicone rubber produced by the method described above was measured with the use of a thermal mechanical analyzer (TMA) at measurement temperatures within the range of 50 to 150° C.

Practical Example 1

In the present practical example, a semiconductor device of the type shown in FIG. 3 was used. More specifically, (8 mm×14 mm) semiconductor chips were fixed to a (70 mm×160 mm) polyimide-resin printed-circuit board via a 35 μm-thick epoxy-resin die-bond agent layer. The printed-circuit board was comprised of a laminated structure formed by applying an 18 μm-thick copper foil via an epoxy-resin adhesive layer having a 17 μm thickness onto one side of a 75 μm-thick polyimide resin film. Circuit patterns were then made from the aforementioned foil. Portions required for wire bonding of the circuit patterns were removed, and the surface of the printed-circuit board was coated with a photosensitive solder mask. The circuit patterns and chip bumps of the semiconductor devices were electrically interconnected and wire bonded via 48 gold bonding wires. In total, 54 semiconductor chips divided into 3 blocks of 18 chips in each were secured to the printed-circuit board and formed into respective wire patterns by wire bonding.

Silicone rubber composition (I), prepared by mixing in a 1:1 weight ratio the liquid A and the liquid B of a two-liquid type silicone rubber composition having components shown in Table 1, was applied at room temperature in amounts of 20 g to predetermined places on a polyimide-resin printed-circuit board. The aforementioned liquid components were mixed by means of a static mixer handgun. Following this, the printed-circuit board was placed into the lower mold of a compression molding machine of the type shown in FIG. 1. The upper and lower moldes of the aforementioned molding machine were coated with release films made from a tetrafluoroethylene resin, and the films were pressed to the sealing surfaces by air suction. Molding was carried out in a clamped state of the printed-circuit board for 2 minutes at 80° C. under a load of 50 kgf/cm². Following this, the mold was opened, the product was removed from the mold, and heat treated for 1 hour in an oven at 120° C. As a result, a sealed semiconductor device having a 500 μm-thick silicone rubber layer on the surfaces of semiconductor chips was produced. Characteristics of the obtained semiconductor device are shown in Table 4.

Practical Example 2

A semiconductor device was prepared in the same manner as in Practical Example 1 with the exception that a silicone rubber composition (II) prepared by mixing in a 1:1 weight ratio the liquid A and the liquid B of a two-liquid type silicone rubber composition having components shown in Table 1 was used instead of the silicone rubber composition (I). Characteristics of the obtained semiconductor device are shown in Table 4.

TABLE 1

| | | Example No. | | | |
|---|---|---|---|---|---|
| | | Practical Example 1 | | Practical Example 2 | |
| | | Components | | | |
| | | I | | II | |
| Silicone Rubber Composition | | Liquid A | Liquid B | Liquid A | Liquid B |
| Composition | | | | | |
| Organopolysiloxane (A-1) | (parts by weight) | 5.7 | 6 | 3.0 | 3.3 |
| Organopolysiloxane (A-3) | (parts by weight) | — | — | 9 | 9 |
| Organopolysiloxane (A-4) | (parts by weight) | 18.8 | 14 | 12.5 | 7.7 |
| Organopolysiloxane (B-1) | (parts by weight) | — | 3 | — | 3 |
| Platinum-type Catalyst (C-1) | (ppm*) | 20 | — | 20 | — |
| Filler (D-1) | (parts by weight) | 68 | 68 | 68 | 68 |

TABLE 1-continued

| | | Example No. | | | |
|---|---|---|---|---|---|
| | | Practical Example 1 | | Practical Example 2 | |
| | | Components | | | |
| | | I | | II | |
| Silicone Rubber Composition | | Liquid A | Liquid B | Liquid A | Liquid B |
| Filler (D-2) | (parts by weight) | 7 | 7 | — | — |
| Filler (D-3) | (parts by weight) | — | — | 7 | 7 |
| Adhesion Promoter | (parts by weight) | — | 2 | — | 2 |
| Pigment | (parts by weight) | 0.5 | — | 0.5 | — |
| Characteristics of Silicone Rubber Composition | | | | | |
| Appearance | | Black Color | | Black Color | |
| Viscosity | (Pa · s) | 170 | | 300 | |
| 80° C.   IP Value | (sec) | 24 | | 12 | |
| T90 | (sec) | 214 | | 220 | |
| 100° C.  IP Value | (sec) | 8 | | 6 | |
| T90 | (sec) | 64 | | 58 | |
| Characteristics of Silicone Rubber | | | | | |
| Appearance | | Black Color | | Black Color | |
| Composite Modules of Elasticity | (MPa) | 40 | | 25 | |
| Coefficient of Thermal Expansion | (ppm/° C.) | 120 | | 120 | |

*Indicate content of metallic platinum (weight unit) in liquid (A)

Practical Example 3

A semiconductor device was prepared in the same manner as in Practical Example 1 with the exception that a one-liquid type silicone rubber composition (III) having components shown in Table 2 was used instead of the silicone rubber composition (I) and that after compression molding for 4 minutes at 120° C. and a pressure of 50 kgf/cm² the product was further heat treated in an oven for 1 hour at 120° C. Characteristics of the obtained semiconductor device are shown in Table 4.

Comparative Example 1

A semiconductor device was prepared in the same manner as in Practical Example 1 with the exception that a one-liquid type silicone rubber composition (IV) having components shown in Table 2 was used instead of the silicone rubber composition (I) and that after compression molding for 4 minutes at 120° C. and a pressure of 50 kgf/cm² the composition was further heat treated in an oven for 1 hour at 120° C. Characteristics of the obtained semiconductor device are shown in Table 4.

Comparative Example 2

A semiconductor device was prepared in the same manner as in Practical Example 1 with the exception that a one-liquid type silicone rubber composition (V) having components shown in Table 2 was used instead of the silicone rubber composition (I) and that after compression molding for 4 minutes at 120° C. and a pressure of 50 kgf/cm² the composition was further heat treated in an oven for 1 hour at 120° C. Characteristics of the obtained semiconductor device are shown in Table 4.

TABLE 2

| | | Example No. | | |
|---|---|---|---|---|
| | | Practical Example 3 | Comparative Example 1 | Comparative Example 2 |
| | | Components | | |
| Silicone Rubber Composition | | III | IV | V |
| Composition | | | | |
| Organopolysiloxane (A-1) | (parts by weight) | 3.6 | — | — |
| Organopolysiloxane (A-2) | (parts by weight) | 11.5 | — | — |
| Organopolysiloxane (A-3) | (parts by weight) | 8 | — | 7.5 |
| Organopolysiloxane (A-4) | (parts by weight) | 8.4 | 43.7 | 33.7 |
| Organopolysiloxane (B-1) | (parts by weight) | 3.2 | 0.4 | 0.3 |
| Platinum-type Catalyst (C-1) | (ppm*) | 5 | 5 | 5 |
| Filler (D-1) | (parts by weight) | 54.2 | 52.6 | 55.6 |
| Filler (D-2) | (parts by weight) | 6 | — | — |
| Filler (D-4) | (parts by weight) | 2.4 | 2.4 | 2.4 |
| Curing Inhibitor | (ppm**) | 1000 | 1000 | 1000 |

TABLE 2-continued

|  |  |  | Example No. | | |
| --- | --- | --- | --- | --- | --- |
|  |  |  | Practical Example 3 | Comparative Example 1 | Comparative Example 2 |
| Silicone Rubber Composition | | | III | IV | V |
| Adhesion Promoter | | (parts by weight) | 0.5 | 0.5 | 0.5 |
| Pigment | | (parts by weight) | 0.5 | 0.5 | 0.5 |
| Characteristics of Silicone Rubber Composition | | | | | |
| Appearance | | | Black Color | Black Color | Black Color |
| Viscosity (Pa · s) | | | 150 | 120 | 140 |
| 80° C. | IP Value | (min) | 65 | 70 | 70 |
|  | T90 | (hour) | >3 | >3 | >3 |
| 100° C. | IP Value | (min) | 22 | 24 | 23 |
|  | T90 | (min) | 38 | 33 | 32 |
| 120° C. | IP Value | (sec) | 200 | 205 | 205 |
|  | T90 | (sec) | 280 | 235 | 230 |
| Characteristics of Silicone Rubber | | | | | |
| Appearance | | | Black Color | Black Color | Black Color |
| Composite Modules of Elasticity | | (MPa) | 20 | 2 | 2 |
| Coefficient of Thermal Expansion | | (ppm/° C.) | 170 | 200 | 190 |

\*Indicate content of metallic platinum (weight unit) in liquid (A)
\*\*Indicate content (weight unit) in the silicone rubber composition.

Comparative Example 3

A semiconductor device was prepared by sealing semiconductor chips with 400 μm-thick cured epoxy resin bodies in the same manner as in Practical Example 1, with the exception that a liquid epoxy resin composition having characteristics shown in Table 3 (CEL-C-7400 of Hitachi Chemical Co., Ltd.) was used instead of the silicone rubber composition (I) and that after compression molding for 5 minutes at 170° C. and a load of 50 kgf/cm² the product was further heat treated in an oven for 1 hour at 150° C. Characteristics of the obtained semiconductor device are shown in Table 4.

TABLE 3

| Characteristics | Liquid Curable Epoxy Resin Composition |
| --- | --- |
| Prior to curing | |
| Appearance | Black Paste |
| Viscosity (Pa · s) | 30 |
| After curing | |
| Appearance | Black Color |
| Hardness (Type A Durometer) | >90 |
| Composite Modulus of Elasticity (GPa) | 7 |
| Coefficient of Thermal Expansion (ppm/° C.) | 6 (from room temperature to 90° C.) |

Viscosity of liquid curable silicone compositions at 25° C. was measured with the use of a BS-type rotary viscometer (the product of Tokimec Co., rotor No. 7, rotation frequency 10 rpm).

Epoxy resin cured bodies were formed by subjecting a liquid curable epoxy resin composition to compression molding for 5 minutes at a 50 kgf/cm² load and 170° C. temperature, and then heat-treating the product for 1 hour in an oven at 150° C. The hardness was measured by a type A durometer according to JIS K 6253. The composite modulus of elasticity at 25° C. was measured with the use of an instrument for measuring viscoelasticity (shear frequency 1 Hz, strain rate 0.5%). The coefficient of thermal expansion was determined by means of a thermomechanical analyzer (TMA) within the temperature range from room temperature to 90° C.

TABLE 4

|  | Practical Example | | | Comparative Example | | |
| --- | --- | --- | --- | --- | --- | --- |
|  | 1 | 2 | 3 | 1 | 2 | 3 |
| Appearance and Fillability | ○ | ○ | ○ | Δ | Δ | ○ |
| Warping (mm) | 0.2 | 0.3 | 0.5 | 0.6 | 0.8 | 5 |
| Cuttability | ○ | ○ | Δ | XX | XX | ○ |

INDUSTRIAL APPLICABILITY

The method of the invention provides efficient manufacturing of sealed semiconductor devices, prevents formation of voids in the sealing material, allows precise control of thickness of the cured silicone bodies that seal the devices, protects the bonding wires from disconnection and undesired contact, and reduces warping of semiconductor chips and printed-circuit boards. In particular, the invention provides such a method of manufacturing sealed semiconductor devices that allows compression molding of a curable silicone composition at the relatively low temperature required for reducing warping of semiconductor chips and printed-circuit boards. Therefore, the method of the invention is suitable for miniaturization and thinning of electronic instruments.

The invention claimed is:

1. A method of manufacturing a semiconductor device sealed in a cured silicone body by placing a semiconductor device into a mold and subjecting a curable silicone composition that fills the spaces between said mold and said semiconductor device to compression molding, wherein said curable silicone composition comprises the following components: (A) an organopolysiloxane having at least two alkenyl groups per molecule; (B) an organopolysiloxane having at least two silicon-bonded hydrogen atoms per molecule;

(C) a platinum-type catalyst; and (D) a filler, wherein either said component (A) contains siloxane units of formula $RSiO_{3/2}$ (where R is a univalent hydrocarbon group) and/or siloxane units of formula $SiO_{4/2}$, or said component (B) contains siloxane units of formula $R'SiO_{3/2}$ (where R' is a hydrogen atom or a univalent hydrocarbon that is free of aliphatic unsaturated carbon-carbon bonds) and/or siloxane units of formula $SiO_{4/2}$, or any of components (A) and (B) contains said siloxane units.

2. The method of claim 1, wherein either said component (A) contains siloxane units of formula $RSiO_{3/2}$ (where R is a univalent hydrocarbon group) and/or a siloxane unit of formula $SiO_{4/2}$ and has a weight-average molecular weight as converted to standard polystyrene equal to or exceeding 1500, or component (B) contains siloxane units of formula $R'SiO_{3/2}$ (where R' is a hydrogen atom or a univalent hydrocarbon that is free of aliphatic unsaturated carbon-carbon bonds) and/or siloxane units of formula $SiO_{4/2}$ and has a weight-average molecular weight as convened to standard polystyrene equal to or exceeding 1500, or any of components (A) and (B) contains said siloxane units and has a weight-average molecular weight as convened to standard polystyrene equal to or exceeding 1500.

3. The method of claim 1, wherein an amount of said component (D) in said curable silicone composition is equal to or exceeds 60 wt. %.

4. The method of claim 1, wherein said curable silicone composition is a two-liquid type composition composed of a composition comprising components (A), (C), (D) as main components without component (B), and another composition comprising components (B), (D) as main components without component (C).

5. The method of claim 1, wherein after the semiconductor device has been placed into a lower mold and said curable silicone composition has been fed into a space between an upper mold and the semiconductor device, the semiconductor device is clamped between said upper mold and said lower mold, and said curable silicone composition is subjected to compression molding.

6. The method of claim 1, wherein a composite modulus of elasticity of the cured silicone body is equal to or below 1 GPa.

7. The method of claim 1, wherein at least two semiconductor devices are sealed, and then the obtained sealed assembly is cut into separate sealed semiconductor devices.

8. The method of claim 1, wherein said unsealed semiconductor device comprises semiconductor chips on a printed-circuit board electrically interconnected via bonding wires.

9. The method of claim 8, wherein said curable silicone composition is supplied to the semiconductor chip on a printed-circuit board, and the connections between semiconductor chips and the bonding wires are sealed with the cured silicone body.

10. The method of claim 1, wherein inner surfaces of the mold are covered with an attached release film.

11. The method of claim 10, wherein the release film is attached to the inner surface of the mold by air suction.

12. A semiconductor device produced by the method according to claim 1.

13. The method of claim 1, wherein the cured silicone body is selected from the group of cured silicone soft rubber, cured silicone hard rubber, and cured silicone resin.

\* \* \* \* \*

UNITED STATES PATENT AND TRADEMARK OFFICE
CERTIFICATE OF CORRECTION

PATENT NO. : 7,651,958 B2  Page 1 of 1
APPLICATION NO. : 10/584032
DATED : January 26, 2010
INVENTOR(S) : Yoshitsuga Morita et al.

It is certified that error appears in the above-identified patent and that said Letters Patent is hereby corrected as shown below:

Column 21, line 19, after "weight as" delete "convened" and insert therein
-- converted --.

Column 21, line 22, after "weight as" delete "convened" and insert therein
-- converted --.

Signed and Sealed this

Twenty-ninth Day of June, 2010

David J. Kappos
*Director of the United States Patent and Trademark Office*